US010636680B2

(12) United States Patent
Shigeta et al.

(10) Patent No.: US 10,636,680 B2
(45) Date of Patent: Apr. 28, 2020

(54) ROBOT TRANSPORT DEVICE

(71) Applicant: SINFONIA TECHNOLOGY CO., LTD., Minato-ku (JP)

(72) Inventors: Takashi Shigeta, Minato-ku (JP); Toshihiro Kawai, Minato-ku (JP); Haruki Takeuchi, Minato-ku (JP); Yoshimasa Suda, Minato-ku (JP); Hisashi Gomi, Minato-ku (JP); Shigenori Ozaki, Nirasaki (JP)

(73) Assignee: SINFONIA TECHNOLOGY CO., LTD., Minato-ku (JP)

( * ) Notice: Subject to any disclaimer, the term of this patent is extended or adjusted under 35 U.S.C. 154(b) by 0 days.

(21) Appl. No.: 15/774,882

(22) PCT Filed: Oct. 28, 2016

(86) PCT No.: PCT/JP2016/082103
§ 371 (c)(1),
(2) Date: May 9, 2018

(87) PCT Pub. No.: WO2017/082086
PCT Pub. Date: May 18, 2017

(65) Prior Publication Data
US 2018/0323086 A1 Nov. 8, 2018

(30) Foreign Application Priority Data
Nov. 10, 2015 (JP) .................................. 2015-220290

(51) Int. Cl.
*H01L 21/67* (2006.01)
*H01L 21/677* (2006.01)
(Continued)

(52) U.S. Cl.
CPC ........ *H01L 21/67017* (2013.01); *B25J 5/005* (2013.01); *B25J 15/00* (2013.01);
(Continued)

(58) Field of Classification Search
CPC combination set(s) only.
See application file for complete search history.

(56) References Cited

U.S. PATENT DOCUMENTS

| 6,287,025 B1 * | 9/2001 | Matsuyama ...... H01L 21/67098 118/66 |
| 2004/0105738 A1 | 6/2004 | Ahn et al. |

(Continued)

FOREIGN PATENT DOCUMENTS

| EP | 0322205 A2 | 6/1989 |
| JP | 2-2605 A | 1/1990 |

(Continued)

OTHER PUBLICATIONS

International Search Report dated Dec. 20, 2016, in PCT/JP2016/082103, filed Oct. 28, 2016.
(Continued)

*Primary Examiner* — Kyle O Logan
(74) *Attorney, Agent, or Firm* — Oblon, McClelland, Maier & Neustadt, L.L.P.

(57) ABSTRACT

Gas is circulated in an entire transportation space. A robot transport device includes a transportation space in which a transport robot is provided and circulation passages by which gas in the transportation space is circulated. Around the transportation space, surrounding spaces are provided. To these surrounding spaces, an object is transported by the transport robot. The transportation space communicates with each of the surrounding spaces via each of openings. The circulation passages are provided to sandwich the transportation space to avoid a working area of the transport robot, including the openings. The circulation passages are provided in pillar portions forming the transportation space.

6 Claims, 2 Drawing Sheets

(51) Int. Cl.
  *B65G 49/07* (2006.01)
  *B25J 5/00* (2006.01)
  *B25J 15/00* (2006.01)
  *H01L 21/687* (2006.01)

(52) U.S. Cl.
  CPC ............ *B65G 49/07* (2013.01); *H01L 21/677* (2013.01); *H01L 21/67766* (2013.01); *H01L 21/68707* (2013.01); *B65G 2201/0297* (2013.01)

(56) References Cited

U.S. PATENT DOCUMENTS

2004/0168742 A1* 9/2004 Kim .................. H01L 21/67017
                                                                              141/98
2015/0170945 A1    6/2015 Segawa et al.

FOREIGN PATENT DOCUMENTS

| JP | 2000-124129 A | 4/2000 |
| JP | 2007-3069 A | 1/2007 |
| JP | 2015-146349 A | 8/2015 |

OTHER PUBLICATIONS

Extended European Search Report dated May 31, 2019 in corresponding European Patent Application No. 16864049.8, 5 pages.

\* cited by examiner

ARRANGEMENT DIRECTION

⊗ VERTICAL DIRECTION (ORTHOGONAL DIRECTION)

ROBOT TRANSPORT DEVICE

TECHNICAL FIELD

The present invention relates to a robot transport device which is configured to transport, by a transport robot provided in a transportation space, an object to a surrounding space.

BACKGROUND ART

The robot transport device is used, for example, in a step of processing substrates such as semiconductor wafers and liquid crystal display panels and a step of culturing or testing cells. These steps require the environments (e.g., gas concentration, temperature, and humidity) of the transportation space to be adjusted. In this connection, Patent Literature 1 (see FIG. 4) teaches that gas (inert gas) in the transportation space (wafer conveyance chamber 9) is circulated.

CITATION LIST

Patent Literatures

Patent Literature 1: Japanese Unexamined Patent Publication No. 2015-146349

SUMMARY OF INVENTION

Technical Problem

In Patent Literature 1, a circulation passage (gas return path 10) is provided on one side of the transportation space (wafer conveyance chamber 9). It is impossible in this case to circulate the inert gas in the entire transportation space, because a gas flow in the transportation space is biased in the transportation space. The temperature and humidity in the transportation space therefore tend to be impartial, and it is difficult to adjust the environments in the entire transportation space to be uniform.

In the robot transport device, downsizing of the device on the whole has been desired in addition to the uniformization of the environments in the entire transportation space.

An object of the present invention is to provide a robot transport device in which arranging the environments in an entire transportation space to be uniform by circulating gas in the entire transportation space, and downsizing the device on the whole are both achieved.

Solution to Problem

According to one aspect of the present invention, a robot transport device is provided, and the robot transport device includes: a transportation space in which a transport robot is provided, a plurality of surrounding spaces to each of which an object is transported by the transport robot being provided around the transportation space, and the transportation space communicating with the surrounding spaces via a plurality of openings, respectively; and a plurality of circulation passages by which gas in the transportation space is circulated, the circulation passages being provided to sandwich the transportation space so as to avoid a working area of the transport robot including the openings, the circulation passages being provided in pillar portions forming the transportation space.

According to this aspect, because the circulation passages are provided to sandwich the transportation space, the environments in the entire transportation space are adjusted to be uniform by circulating the gas in the entire transportation space. Furthermore, because the circulation passages are provided in the pillar portions forming the transportation space, the robot transport device is downsized on the whole. To put it differently, according to the aspect described above, it is possible to achieve both arranging the environments in the entire transportation space to be uniform by circulating the gas in the entire transportation space, and downsizing the device on the whole.

The robot transport device may be arranged such that the pillar portions are connected to a wall portion which forms the transportation space and is provided with the openings. According to this arrangement, the strength of the robot transport device is improved.

The robot transport device may be arranged such that three or more of the openings are lined up along a predetermined arrangement direction, and one of the circulation passages is provided between every pair of openings neighboring each other in the arrangement direction, among the three or more of the openings. With this arrangement, the circulation passages are efficiently provided in a dispersed manner, and hence the environments of the entire transportation space are adjustable.

The robot transport device of the present invention may be arranged such that the transport robot is movable in an arrangement direction of the openings, and a filter for removing dust in the gas is provided in a region where the gas circulated in the transportation space and the circulation passages passes. With this arrangement, dust generated by the movement of the transport robot is removed by the filter, and hence the transportation space is maintained to be clean.

The robot transport device of the present invention may be arranged such that the circulation passages extend to be parallel to one another along an orthogonal direction orthogonal to the arrangement direction, and each of the circulation passages communicates with the transportation space via an intake port on one end side and an exhaust port on the other end side and allows the gas in the transportation space sucked through the intake port to return to the transportation space from the exhaust port, a shared space is provided to allow the exhaust port of each of the circulation passages to communicate with the transportation space, and the gas exhausted from the exhaust port of each of the circulation passages flows from the other end side toward the one end side in the orthogonal direction so as to return to the transportation space via the shared space. With this arrangement, dust generated by the movement of the transport robot is further efficiently collected, and hence the transportation space is further maintained to be clean.

The robot transport device may be arranged such that the shared space spreads over the entirety of a plane orthogonal to the orthogonal direction, relative to the transportation space. This arrangement makes it possible to deliver the gas to the entirety of the transportation space.

Advantageous Effects of Invention

According to the present invention, because the circulation passages are provided to sandwich the transportation space, it is possible to circulate gas in the entire transportation space.

DESCRIPTION OF EMBODIMENTS

Figure 1:
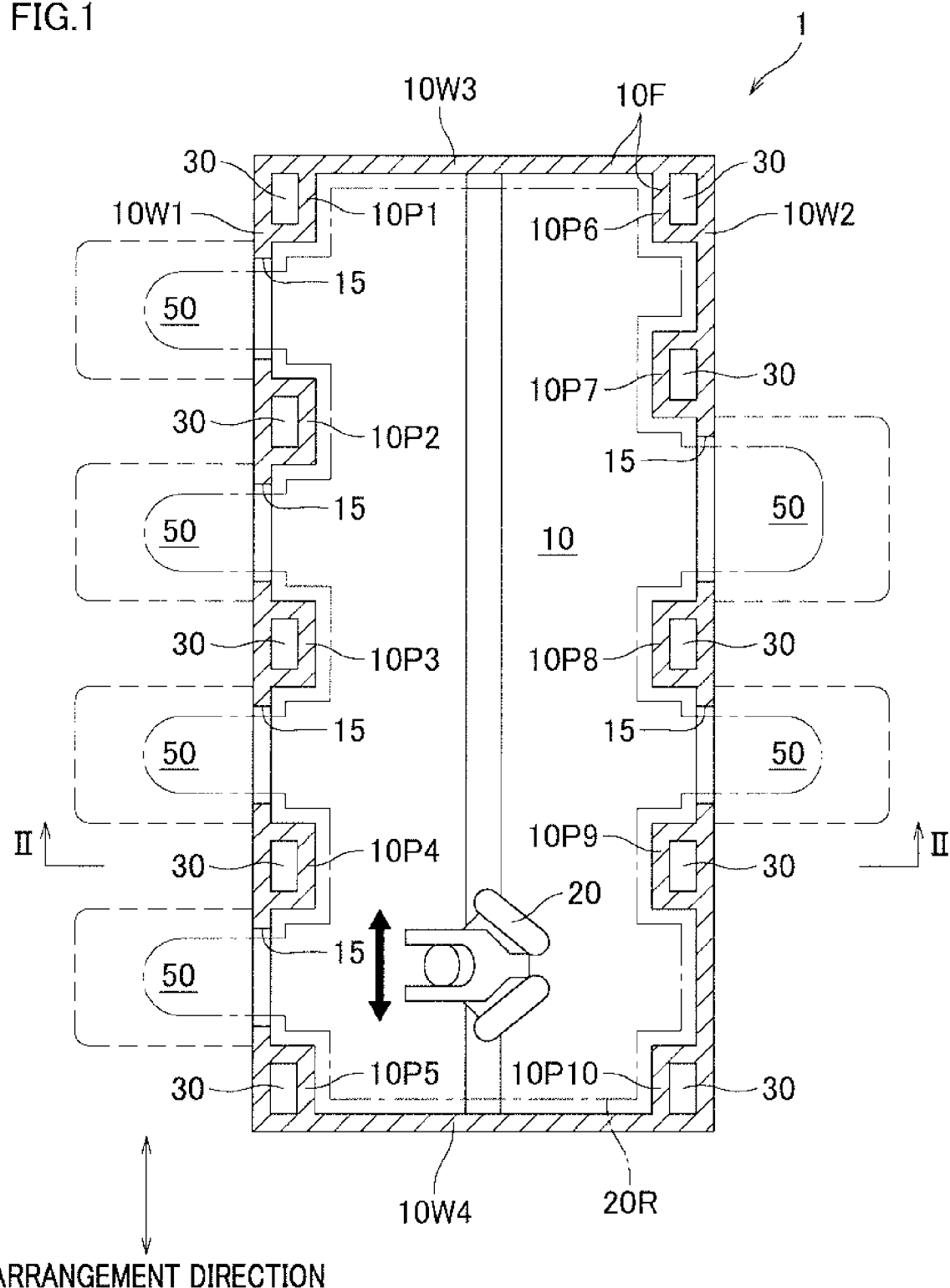
FIG. 1 is a cross section of a robot transport device of an embodiment of the present invention taken along the horizontal direction.

A robot transport device 1 of an embodiment of the present invention is used in a step of processing semiconductor wafers, and includes a transportation space 10 in which a transport robot 20 is provided, as shown in FIG. 1. The transportation space 10 is formed of a frame 10F which is constituted by pillar portions 10P1 to 10P10 and wall portions 10W1 to 10W4.

In each of the pillar portions 10P1 to 10P10, a circulation passage 30 is provided to circulate gas (e.g., air, inert gas, and sterilizing gas) in the transportation space 10. Each circulation passage 30 extends along the vertical direction (orthogonal direction).

Among the wall portions 10W1 to 10W4, wall portions 10W1 and 10W2 oppose to each other, and four openings 15 are formed in the wall portion 10W1 whereas two openings 15 are formed in the wall portion 10W2. In each of the wall portions 10W1 and 10W2, the openings 15 are lined up in an arrangement direction indicated in FIG. 1.

The pillar portions 10P1 to 10P5 are connected to the wall portion 10W1, whereas the pillar portions 10P6 to 10P10 are connected to the wall portion 10W2. One of the circulation passages 30 is provided between every pair of openings 15 which neighbor each other in the arrangement direction.

Around the transportation space 10, a plurality of surrounding spaces (e.g., a load port device and a load lock chamber) 50 are provided. To these surrounding spaces, an object (a semiconductor wafer in the present embodiment) is transported by the transport robot 20. In the present embodiment, four surrounding spaces 50 are disposed to oppose the wall portion 10W1 and two surrounding spaces 50 are disposed to oppose the wall portion 10W2. The transportation space 10 is able to communicate with each of the surrounding spaces 50 via each of the openings 15. Each opening 15 is provided with a door (not illustrated). As the door is opened or closed, the transportation space 10 and the surrounding space 50 communicate with each other via the opening 15 or the communication is blocked.

The transport robot 20 is movable in the arrangement direction of the openings 15. A working area 20R of the transport robot 20 includes the substantially entire transportation space 10, each opening 15, and a part of each surrounding space 50. The circulation passages 30 are provided to sandwich the transportation space 10 so as to avoid the working area 20R.

Figure 2:
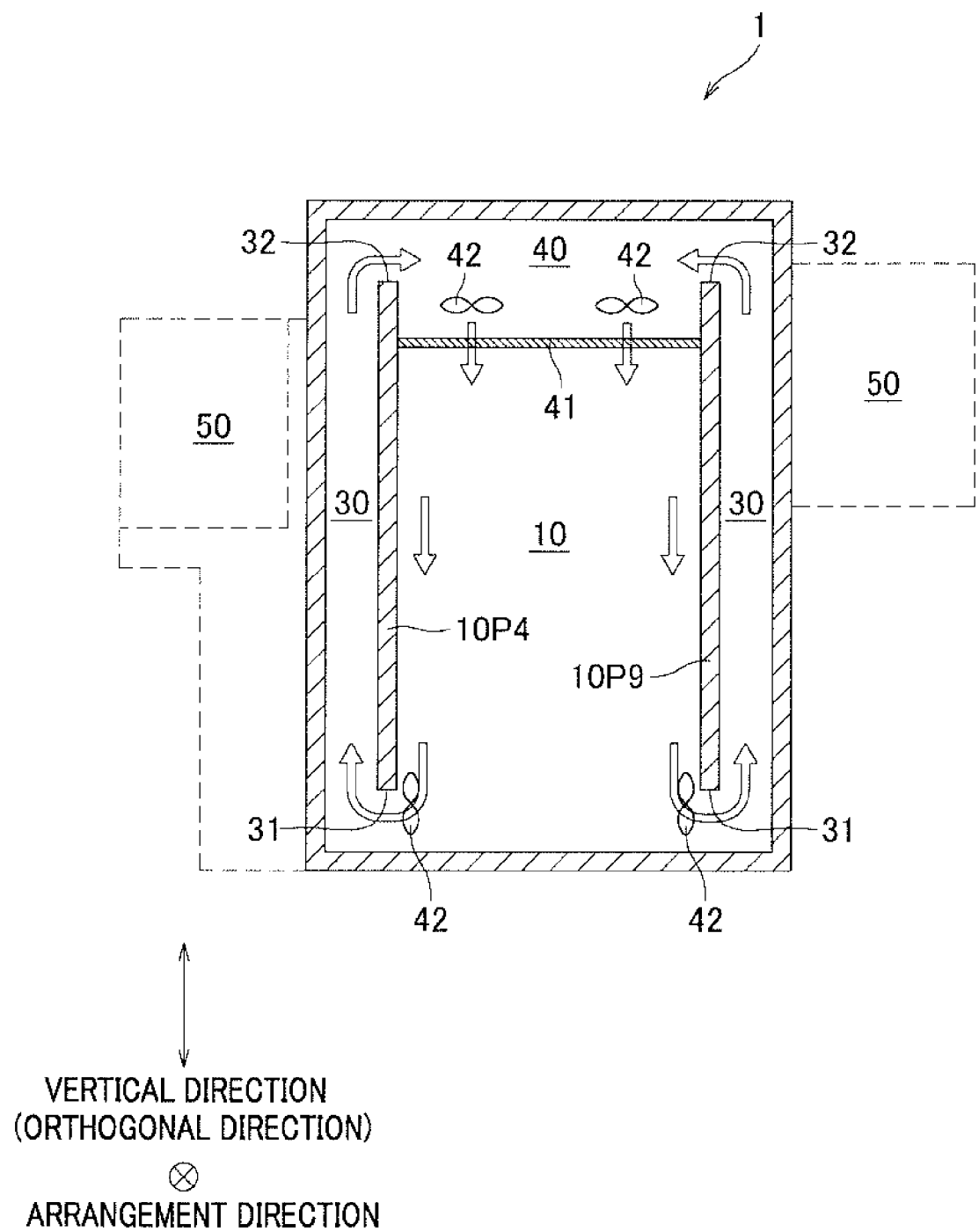
FIG. 2 is a cross section of the robot transport device of the embodiment of the present invention taken along a line II-II in FIG. 1.

As shown in FIG. 2, the circulation passages 30 extend to be parallel to one another along the vertical direction. Each circulation passage 30 communicates with the transportation space 10 via an intake port 31 on one end side (lower side) and an exhaust port 32 on the other end side (upper side). The intake port 31 and the exhaust port 32 are openings formed at a lower end portion and an upper end portion of each of the pillar portions 10P1 to 10P10. Each circulation passage 30 is structured to return the gas in the transportation space 10 sucked through the intake port 31, from the exhaust port 32 to the transportation space 10.

The robot transport device 1 further includes a shared space 40 which allows the exhaust ports 32 of the circulation passages 30 to communicate with the transportation space 10. The shared space 40 is provided above the transportation space 10 (i.e., at a ceiling part of the robot transport device 1) and spreads over the entire horizontal plane (orthogonal to the orthogonal direction) relative to the transportation space 10. The gas exhausted from the exhaust ports 32 of the circulation passages 30 flows from the other end side (upper side) toward the one end side (lower side) in the vertical direction and returns to the transportation space 10 via the shared space 40.

The robot transport device 1 further includes a filter 41 which is provided in a region where the gas circulated in the transportation space 10 and the circulation passages 30 passes. The filter 41 is arranged to remove dust from the gas. In the present embodiment, the filter 41 is provided between the transportation space 10 and the shared space 40 and extends along the horizontal plane.

In order to generate the circulating flows described above, fans 42 are provided in the shared space 40 and in the vicinity of the intake ports 31 in the transportation space 10.

As described above, the circulation passages 30 are provided to sandwich the transportation space 10 in the present embodiment. It is therefore possible to adjust the environments in the entire transportation space 10 to be uniform by circulating the gas in the entire transportation space 10. Furthermore, the circulation passages 30 are provided in the pillar portions 10P1 to 10P10 forming the transportation space 10. This makes it possible to downsize the entire robot transport device 1. To put it differently, according to the aspect described above, it is possible to achieve both arranging the environments in the entire transportation space to be uniform by circulating the gas in the entire transportation space 10, and downsizing the robot transport device 1 on the whole.

The pillar portions 10P1 to 10P10 are connected to the wall portions 10W1 and 10W2 which form the transportation space 10 and have the openings 15. According to this arrangement, the strength of the robot transport device 1 is improved.

One of the circulation passages 30 is provided between every pair of openings 15 which neighbor each other in the arrangement direction. With this arrangement, the circulation passages 30 are efficiently provided in a dispersed manner, and hence the environments of the entire transportation space 10 are adjustable.

The robot transport device 1 further includes a filter 41 which is provided in a region where the gas circulated in the transportation space 10 and the circulation passages 30 passes and is arranged to remove dust from the gas. With this arrangement, dust generated by the movement of the transport robot 20 is removed by the filter 41, and hence the transportation space 10 is maintained to be clean.

The circulation passages 30 extend to be parallel to one another along the vertical direction (orthogonal direction), and each of the circulation passages 30 communicates with the transportation space 10 via the intake port 31 on the one end side and the exhaust port 32 on the other end side and allows the gas in the transportation space 10 sucked through the intake port 31 to return to the transportation space 10 from the exhaust port 32. The robot transport device 1 further includes the shared space 40 which allows the exhaust ports 32 of the circulation passages 30 to communicate with the transportation space 10, and the gas exhausted from the exhaust ports 32 of the circulation passages 30 flows from the other end side (upper side) toward the one end side (lower side) in the vertical direction so as to return to the transportation space 10 via the shared space 40. With this arrangement, dust generated by the movement of the transport robot 20 is further efficiently collected, and hence the transportation space 10 is further maintained to be clean.

The shared space 40 spreads over the entire horizontal plane (orthogonal to the orthogonal direction) relative to the transportation space 10. This arrangement makes it possible to deliver the gas to the entirety of the transportation space 10.

A preferred embodiment of the present invention has been described. It should be noted that the present invention is not limited to the above-described embodiment, and various changes can be made herein without departing from the spirit and scope of the invention as defined by the appended claims, as exemplified below.

The robot transport device of the present invention is not necessarily used in the step of processing semiconductor wafers. The device may be used in a step of processing liquid crystal display panels, a step of culturing or testing cells, or any other steps.

The objects to be transported may be variously changed in accordance with the step in which the robot transport device is used. (For example, when the robot transport device is used for the step of processing liquid crystal display panels, the liquid crystal display panels are the objects.)

Clean air, gas, or the like may be supplied to the transportation space via the circulation passages, and gas including the supplied gas may be circulated in the entire transportation space.

The circulation passages do not necessarily extend in the vertical direction, and may extend in the horizontal direction, for example. The circulation passages may not be parallel to one another, and may intersect with one another. (For example, a circulation passage extending in the vertical direction and a circulation passage extending in the horizontal direction may be provided.) Each circulation passage may not be linear in shape but curved in shape.

The positions and the number of the fans are not particularly limited, on condition that gas flows circulating in the transportation space and the circulation passages are generated.

In a region where the gas circulated in the transportation space and the circulation passages passes, a temperature humidity controller may be provided. Examples of the temperature humidity controller include a dryer for decreasing humidity, a cooler for decreasing temperature, and an ionizer for removing electricity from semiconductor wafers. This arrangement makes it possible to keep the temperature of the entire transportation space to be uniform.

The surrounding spaces may be provided at any given positions of the transportation space. For example, the surrounding spaces may be provided to entirely surround the circumference of the transportation space. (In the embodiment above, surrounding spaces opposing the wall portions 10W3 and 10W4 may be further provided.) Alternatively, the surrounding spaces may be provided only on one side of the transportation space. (In the embodiment above, the surrounding spaces may be provided only at the wall portion 10W1 or only at the wall portion 10W2.)

The surrounding spaces may be identical with one another or different from one another.

Each opening may not be provided with a door.

The arrangement direction of the openings may not be the horizontal direction but be the vertical direction, for example.

The moving direction of the transport robot may not be the horizontal direction but be the vertical direction, for example.

When the openings are lined up in the vertical direction and the transport robot is movable in the vertical direction, a circulating flow in the horizontal direction may be generated.

REFERENCE SIGNS LIST 1 robot transport device
10 transportation space
10P1 to 10P10 pillar portions
10W1 to 10W4 wall portions
15 opening
20 transport robot
20R working area of transport robot
30 circulation passage
31 intake port
32 exhaust port
40 shared space
41 filter
42 fan
50 surrounding space

The invention claimed is:

1. A robot transport device comprising:
a transportation space in which a transport robot is provided, a plurality of surrounding spaces to each of which an object is transported by the transport robot being provided around the transportation space, and the transportation space communicating with the surrounding spaces via a plurality of openings, respectively; and
a plurality of circulation passages by which gas in the transportation space is circulated, the circulation passages being provided to sandwich the transportation space in an arrangement direction along which the openings are lined up to avoid a working area of the transport robot including the openings,
the circulation passages being provided in pillar portions, the pillar portions forming the transportation space and extending along an orthogonal direction orthogonal to the arrangement direction.

2. The robot transport device according to claim 1, wherein, the pillar portions are connected to a wall portion which forms the transportation space and is provided with the openings.

3. The robot transport device according to claim 1, wherein, three or more of the openings are lined up along the arrangement direction, and
one of the circulation passages is provided between every pair of openings neighboring each other in the arrangement direction, among the three or more of the openings.

4. The robot transport device according to claim 1, wherein, the transport robot is movable in the arrangement direction and
a filter for removing dust in the gas is provided in a region where the gas circulated in the transportation space and the circulation passages passes.

5. The robot transport device according to claim 4, wherein,
the circulation passages extend to be parallel to one another, and each of the circulation passages communicates with the transportation space via an intake port on one end side and an exhaust port on the other end side and allows the gas in the transportation space sucked through the intake port to return to the transportation space from the exhaust port, a shared space is provided to allow the exhaust port of each of the circulation passages to communicate with the transportation space, and the gas exhausted from the exhaust port of each of the circulation passages flows from the other end side toward the one end side in the orthogonal direction so as to return to the transportation space via the shared space.

6. The robot transport device according to claim 5, wherein, the shared space spreads over the entirety of a plane orthogonal to the orthogonal direction, relative to the transportation space.

\* \* \* \* \*